(12) United States Patent
Lei et al.

(10) Patent No.: US 9,275,902 B2
(45) Date of Patent: Mar. 1, 2016

(54) DICING PROCESSES FOR THIN WAFERS WITH BUMPS ON WAFER BACKSIDE

(71) Applicants: Wei-Sheng Lei, San Jose, CA (US);
James S. Papanu, San Rafael, CA (US);
Aparna Iyer, Sunnyvale, CA (US);
Brad Eaton, Menlo Park, CA (US);
Ajay Kumar, Cupertino, CA (US)

(72) Inventors: Wei-Sheng Lei, San Jose, CA (US);
James S. Papanu, San Rafael, CA (US);
Aparna Iyer, Sunnyvale, CA (US);
Brad Eaton, Menlo Park, CA (US);
Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/226,038

(22) Filed: Mar. 26, 2014

(65) Prior Publication Data

US 2015/0279739 A1    Oct. 1, 2015

(51) Int. Cl.
*H01L 21/78* (2006.01)
*H01L 23/544* (2006.01)

(52) U.S. Cl.
CPC .............. *H01L 21/78* (2013.01); *H01L 23/544* (2013.01)

(58) Field of Classification Search
CPC ............ H01L 21/78; H01L 2221/68327; H01L 23/3128; H01L 23/49816; H01L 24/13; H01L 24/14; H01L 24/16; H01L 2224/73204; H01L 2224/81; H01L 2224/94; H01L 2224/97; H01L 2225/06513; H01L 2924/014; H01L 2924/15311
USPC ........... 438/462; 219/121.67, 121.69, 121.72, 219/121.85
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 Pages.

(Continued)

*Primary Examiner* — Pamela E Perkins
(74) *Attorney, Agent, or Firm* — Blakely Sokoloff Taylor Zafman LLP

(57) ABSTRACT

Approaches for front side laser scribe plus backside bump formation and laser scribe and plasma etch dicing process are described. For example, a method of dicing a semiconductor wafer having integrated circuits on a front side thereof involves forming first scribe lines on the front side, between the integrated circuits, with a first laser scribing process. The method also involves forming arrays of metal bumps on a backside of the semiconductor wafer, each array corresponding to one of the integrated circuits. The method also involves forming second scribe lines on the backside, between the arrays of metal bumps, with a second laser scribing process, wherein the second scribe lines are aligned with the first scribe lines. The method also involves plasma etching the semiconductor wafer through the second scribe lines to singulate the integrated circuits.

25 Claims, 10 Drawing Sheets

(56) References Cited

U.S. PATENT DOCUMENTS

| | | | |
|---|---|---|---|
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0137097 A1* | 5/2009 | Lin et al. ............... 438/462 |
| 2009/0255911 A1 | 10/2009 | Krishnaswami et al. |
| 2010/0013036 A1 | 1/2010 | Carey |
| 2010/0072635 A1* | 3/2010 | Kuo et al. ............... 257/797 |
| 2010/0248451 A1 | 9/2010 | Pirogovsky et al. |
| 2011/0312157 A1 | 12/2011 | Lei et al. |
| 2013/0045554 A1 | 2/2013 | Yamazaki |
| 2013/0049195 A1* | 2/2013 | Wu et al. ............... 257/738 |
| 2013/0065378 A1 | 3/2013 | Johnson et al. |
| 2013/0230972 A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet at al., "Apparatus and Methods for Dry Etch With Edge, Side and Back Protection", U.S. Appl. No. 61/491,693, filed May 31, 2011 24 pgs.

Lel. Wei-Sheng et al., "Wafer Dicing From Wafer Backside and Front Side," U.S. Appl. No. 14/103,534, filed Dec. 11, 2013, 36 pgs.

* cited by examiner

DICING PROCESSES FOR THIN WAFERS WITH BUMPS ON WAFER BACKSIDE

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having integrated circuits on a front side thereof involves forming first scribe lines on the front side, between the integrated circuits, with a first laser scribing process. The method also involves forming arrays of metal bumps on a backside of the semiconductor wafer, each array corresponding to one of the integrated circuits. The method also involves forming second scribe lines on the backside, between the arrays of metal bumps, with a second laser scribing process, wherein the second scribe lines are aligned with the first scribe lines. The method also involves plasma etching the semiconductor wafer through the second scribe lines to singulate the integrated circuits.

In another embodiment, a method of dicing a semiconductor wafer having a front side having integrated circuits with first scribe lines there between involves forming arrays of metal bumps on a backside of the semiconductor wafer, each array corresponding to one of the integrated circuits. The method also involves forming second scribe lines on the backside, between the arrays of metal bumps, with a laser scribing process, wherein the second scribe lines are aligned with the first scribe lines. The method also involves plasma etching the semiconductor wafer through the second scribe lines to singulate the integrated circuits.

In another embodiment, a method of dicing a semiconductor wafer having integrated circuits on a front side thereof involves forming first scribe lines on the front side, between the integrated circuits, with a first laser scribing process. The method also involves, subsequently, forming second scribe lines on the backside between arrays of metal bumps formed on the backside, the second scribe lines formed with a second laser scribing process, wherein the second scribe lines are aligned with the first scribe lines. The method also involves plasma etching the semiconductor wafer through the second scribe lines to singulate the integrated circuits.

BRIEF DESCRIPTION OF THE DRAWINGS

FIG. 2A illustrates a starting semiconductor substrate or wafer having a backside attached to a carrier film or tape;

FIG. 2B illustrates the structure of FIG. 2A following a first laser scribing process to remove streets and to provide laser scribe lines;

FIG. 2C illustrates the structure of FIG. 2B following demounting from the carrier film or tape and mounting to a carrier wafer from the semiconductor substrate or wafer front side;

FIG. 2D illustrates the structure of FIG. 2C following semiconductor substrate or wafer thinning, backside passivation layer formation, and backside metal bumps formation;

FIG. 2E illustrates the structure of FIG. 2D following demounting from the carrier wafer mounting to a second carrier film or tape from the semiconductor substrate or wafer front side, and mask layer formation on the semiconductor substrate or wafer backside;

FIG. 2F illustrates the structure of FIG. 2E following laser scribing of the mask layer the passivation layer from the semiconductor substrate or wafer backside;

FIG. 2G illustrates the structure of FIG. 2F following a plasma etch process to singulate the semiconductor substrate or wafer into individual ICs; and FIG. 2H illustrates the structure of FIG. 2G following mask material removal, die cleaning, and die pick.

DETAILED DESCRIPTION

Figure 1A:
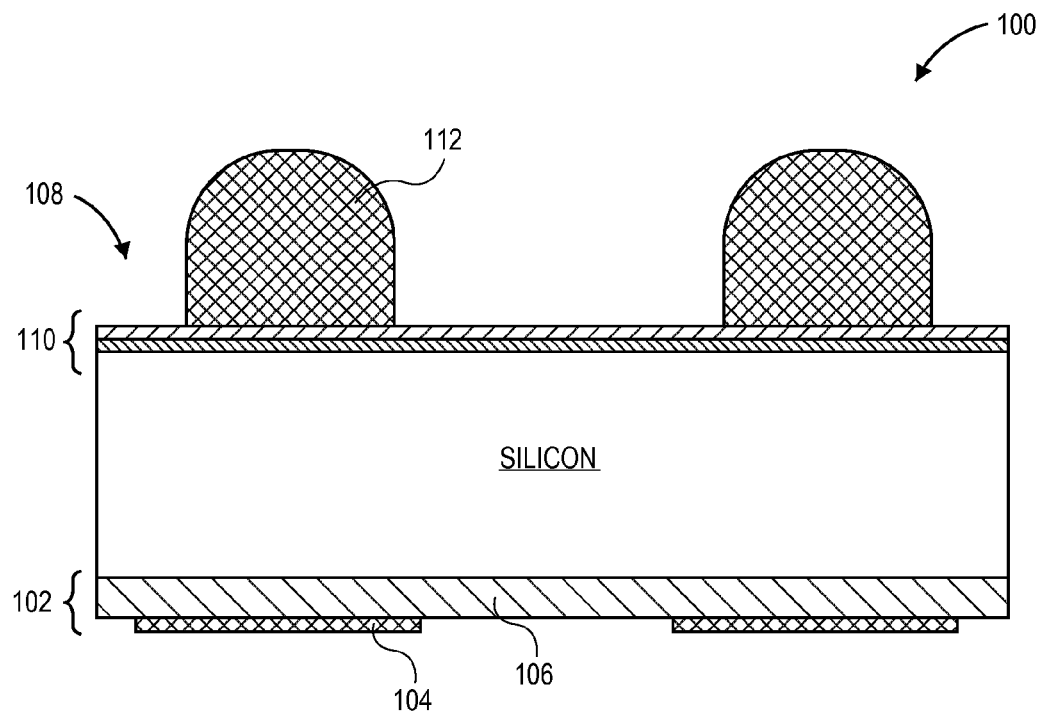
FIG. 1A illustrates a cross-sectional view of a backside-bumped die, in accordance with an embodiment of the present invention.

Methods of dicing semiconductor wafers, each wafer having a plurality of integrated circuits thereon, are described. In the following description, numerous specific details are set forth, such as femtosecond-based laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving initial laser scribing processes and subsequent plasma treatment may be implemented for die singulation. The laser scribe process may be used to cleanly remove one or more of a mask layer, organic and inorganic dielectric layers, and device layers on a front side of a wafer, as well as cut into the substrate. The substrate may then be thinned from the wafer backside and, subsequently, metal bumps may be formed on the wafer backside. An additional laser scribe operation may then be used to scribe the backside. The plasma etch or treatment portion of the dicing process may then be employed to yield clean die or chip singulation or dicing.

More generally, one or more embodiments are directed to wafer or substrate dicing from the wafer or substrate backside and front side in a combined approach. Particular embodiments include methods and system to dice wafers with backside metal bumps formed thereon. For example, in three-dimensional (3D) logic chip/memory chip stacking applications, metal bumps having a height as high as 100 microns or more are placed on the backside of a wafer. The bump formation as a backend process is realized after device layers are completed on front side and the wafer is subsequently thinned from backside. Directly dicing a thin device wafer with tall bumps on backside can be very challenging. For example, blade dicing from the device side can cause mechanical stress due to uneven mounting of wafers from backside caused by bumps. In the case that a low k dielectric device layer is included, blade dicing from either side can lead to low k material fracturing and delamination, peeling, etc. Full thickness laser dicing such as processes using nanosecond ultraviolet (UV) lasers can glue the singulated dies onto the dicing tape materials, making them hard to pick. Furthermore, conventionally, dicing prior to grinding has been deployed but this is limited to the applications where once backside grinding and polishing is completed, no further processes or functional layers are added onto backside.

More particularly, embodiments described herein may be directed to approaches where, after device layers are formed through a front end of line process flow, a femtosecond laser scribing process is used to remove the device layer along the dicing street. Then, the wafer device side is mounted onto a carrier wafer to initiate backside process flow operations, including wafer thinning, dielectric formation and patterning, bump formation, etc. Upon completion of backside processes, the wafer is demounted from the carrier wafer and transferred to a dicing tape (with the device side mounted onto the tape). A mask layer is added, e.g., a water soluble mask layer, onto the backside via wet processes such as spin coating or dry film vacuum lamination. Next, a hybrid laser scribing and plasma etching dicing scheme is applied from the wafer backside. The hybrid dicing scheme may involve use of a femtosecond-laser to pattern the mask and underneath dielectric layers and to expose a silicon (Si) substrate, followed by plasma etching and plasma cleaning of side wall, and wafer cleaning to remove mask. Finally, the wafer is moved to die pick and place. In an embodiment, an advantage of the approaches described herein is that laser scribing of fragile device layer at regular thickness wafer level is much more reliable and safe.

It is to be appreciated that processes described herein can be used to accommodate fabrication of a variety of architectures involving backside bumping on a semiconductor die. In a first example, FIG. 1A illustrates a cross-sectional view of a backside-bumped die, in accordance with an embodiment of the present invention. Referring to FIG. 1A, a semiconductor structure 100, such as a logic die, has an active surface 102 having metal pads 104 on a device layer 106. The device layer may include a semiconductor device layer and associated dielectric (including low-k layers) and metallization layers. A backside 108 of the structure 100 includes dielectric and/or passivation layers 110, as well as solder bumps 112, such as copper bumps.

Figure 1B:
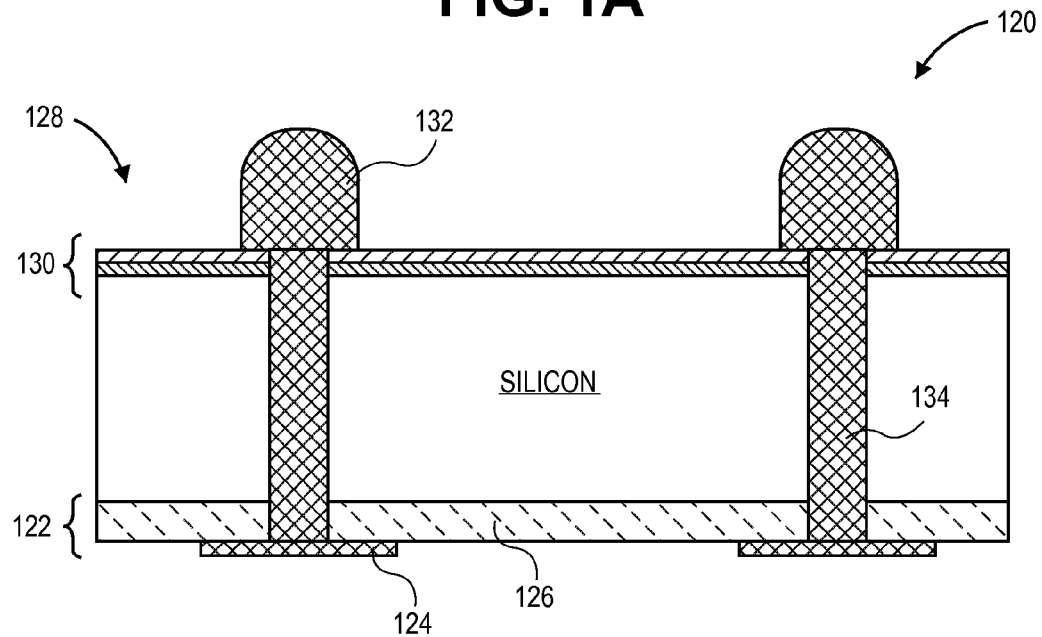
FIG. 1B illustrates a cross-sectional view of another backside-bumped die, in accordance with another embodiment of the present invention.

In a second example, FIG. 1B illustrates a cross-sectional view of another backside-bumped die, in accordance with another embodiment of the present invention. Referring to FIG. 1B, a semiconductor structure 120, such as a memory die, has an active surface 122 having metal pads 124 on a device layer 126. The device layer may include a semiconductor device layer and associated dielectric (including low-k layers) and metallization layers. A backside 128 of the structure 120 includes dielectric and/or passivation layers 130, as well as solder bumps 132, such as copper bumps. Through silicon vias (TSVs) 134 connect the pads 124 with the bumps 132 and run through the silicon substrate.

Figure 1C:
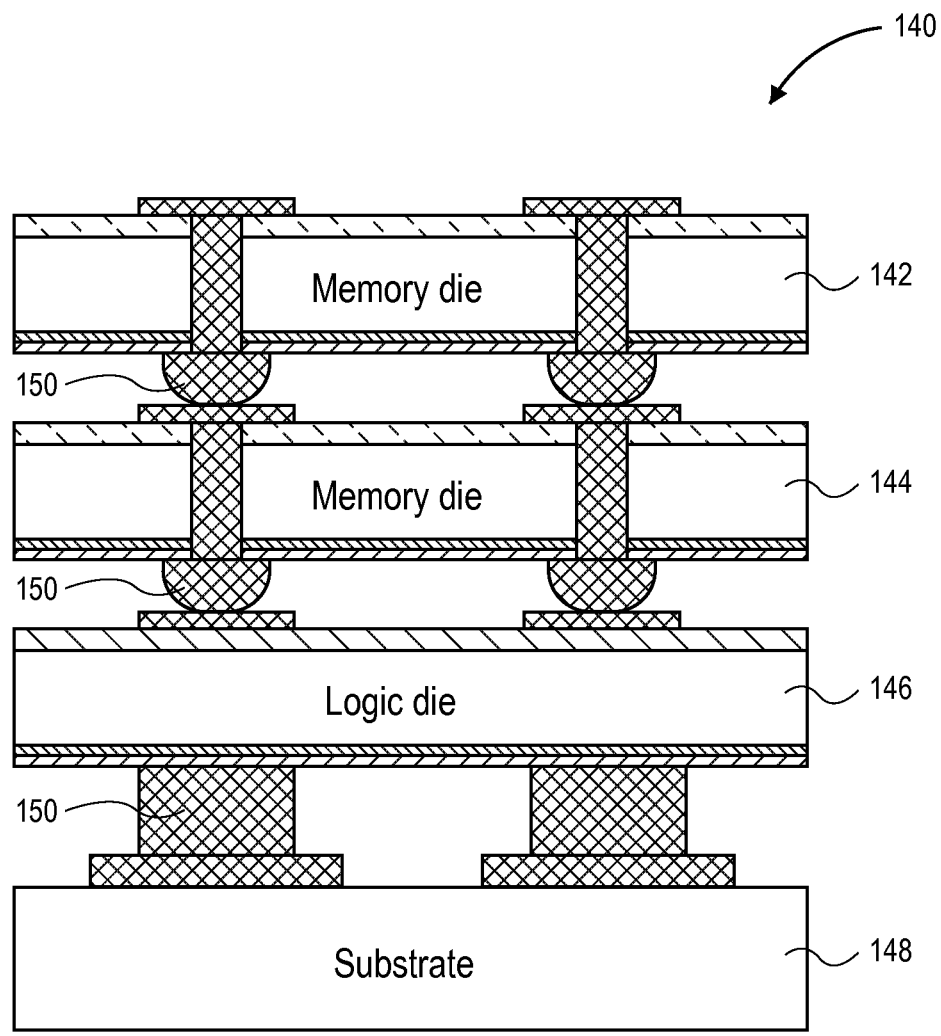
FIG. 1C illustrates a cross-sectional view of a stack of backside-bumped dies as coupled to a package substrate, in accordance with an embodiment of the present invention.

In a third example, FIG. 1C illustrates a cross-sectional view of a stack of backside-bumped dies as coupled to a package substrate, in accordance with an embodiment of the present invention. Referring to FIG. 1C, a logic die/memory die hybrid 3-D stacking structure 140 includes a first backside-bumped memory die 142 coupled to a second backside-bumped memory die 144. The second backside-bumped memory die 144 is coupled to a logic die 146. The logic die 146 is coupled to a package substrate 148. As depicted in FIG. 1C, the coupled can be effected by use of backside bumps 150 and TSVs 152. It is to be appreciated that, although not depicted in FIG. 1C, an underfill material may be included between substrate/die, or die/die in final products as a passivation layer.

Accordingly, as described in greater detail below, one or more embodiments involve dicing with laser scribing performed from both a wafer backside and front side. As an example, FIGS. 2A-2H illustrate cross-sectional views representing various operations in a front side laser scribe plus backside bump formation and laser scribe and plasma etch dicing process, in accordance with an embodiment of the present invention.

Figure 2A:
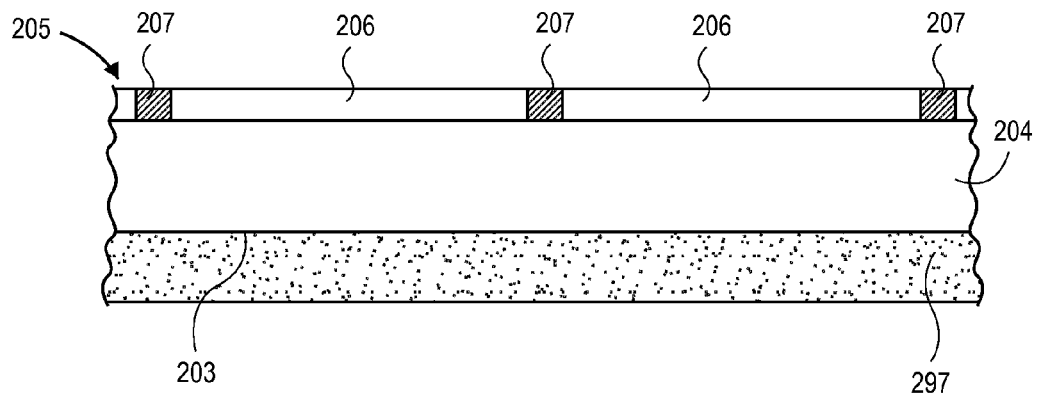
FIGS. 2A-2H illustrate cross-sectional views representing various operations in a front side laser scribe plus backside bump formation and laser scribe and plasma etch dicing process, in accordance with an embodiment of the present invention, where.

Referring to FIG. 2A, a semiconductor substrate or wafer 204 (only a portion of which is shown) has a backside 203 and a front side 205. The semiconductor substrate or wafer 204 is attached to a carrier film or tape 297, such as the tape of a substrate carrier. Although not show, it is to be appreciated that the carrier film or tape 297 may be surrounded by a tape frame. The semiconductor substrate or wafer 204 front side 205 has integrated circuits 206 thereon. The integrated circuits 206 are separated by streets 207, which may include metallization and dielectric layers similar to those of the integrated circuits 206. For example, streets 207 may be composed of layers of dielectric materials, semiconductor materials, and metallization. In one embodiment, one or more of the streets 207 includes test devices similar to the actual devices of the integrated circuits 206. It is to be appreciated that the integrated circuits 206 (and the streets 207) need not be planar as shown. Instead, topography may be present due to the inclusion of bumps/pillars and other like features.

Figure 2B:
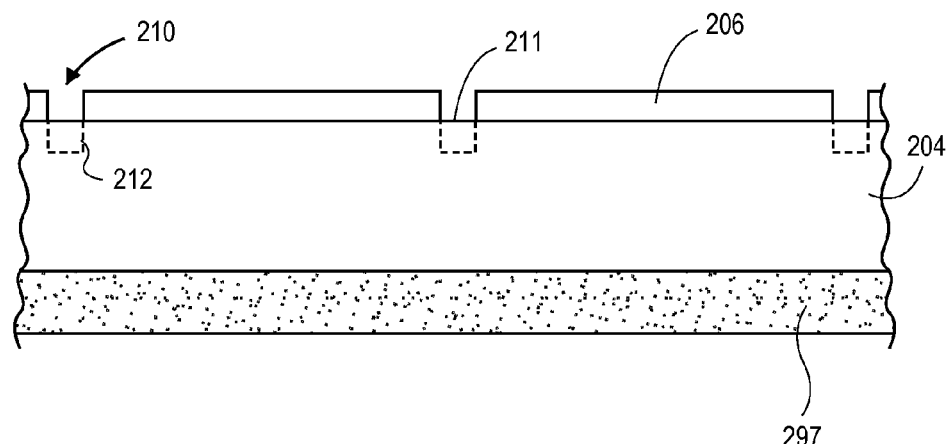

Referring to FIG. 2B, the streets 207 are scribed from the semiconductor substrate or wafer 204 front side 205 with a first laser scribing process to provide laser scribe lines 210, and to remove the material from streets 207. The laser scribe lines 210 may terminate at the surface 211 of the semiconductor substrate or wafer 204 or may extend as trenches 212 into the semiconductor substrate or wafer 204. A mask-free first scribing process is depicted in FIG. 2B. However, it is to be appreciated that masked scribing process may also be performed.

Figure 2C:
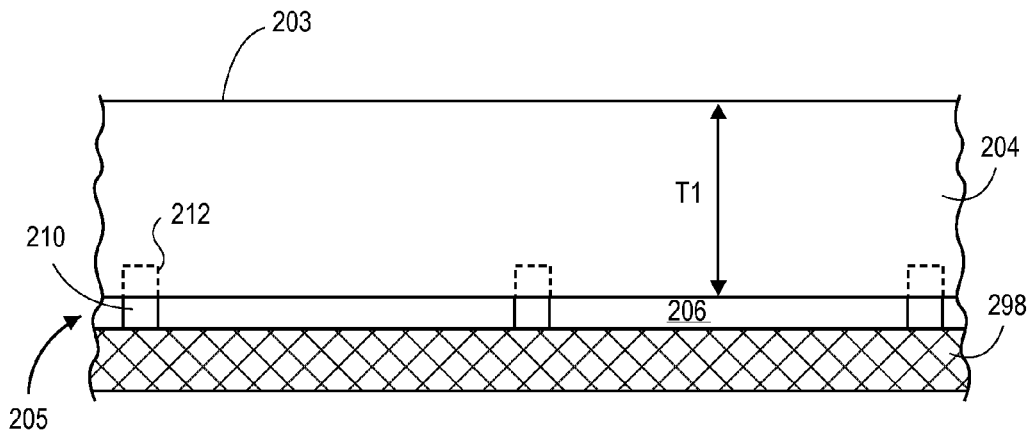

Referring to FIG. 2C, the front side-scribed semiconductor substrate or wafer 204 is demounted from the carrier film or tape 297 and is mounted to a carrier wafer 298, or the like, from the semiconductor substrate or wafer 204 front side 205. At this stage, the semiconductor substrate or wafer 204 has an initial thickness T1.

Figure 2D:
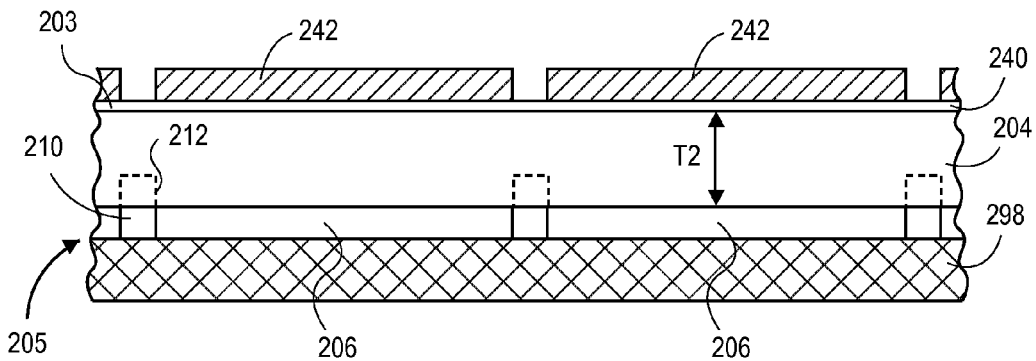

Referring to FIG. 2D, the semiconductor substrate or wafer 204 is thinned from the backside 203 to provide a final thickness T2 less than the initial thickness T1. The thinning may involve a backside grind process. One or more passivation layers 240 are then formed on the wafer backside 203. Arrays 242 of backside metal bumps are then formed on the one or more passivation layers 240 on the backside 203. It is to be appreciated that each array 242 depicted in FIG. 2D represents a plurality of metal bumps that can be formed to any suitable thickness and pitch. Also, as depicted the arrays may be fabricated in alignment with the integrated circuits 206 but not over regions corresponding to the scribe lines 210. In an embodiment, the each array 242 of backside 203 metal bumps includes solder bumps and corresponding pads. In one embodiment, the metal bumps are composed substantially of copper, but embodiments are not so limited. In one embodiment, the final thickness, T2, is less than approximately 300 microns. In one such embodiment, the final thickness, T2, is less than approximately 100 microns.

Figure 2E:
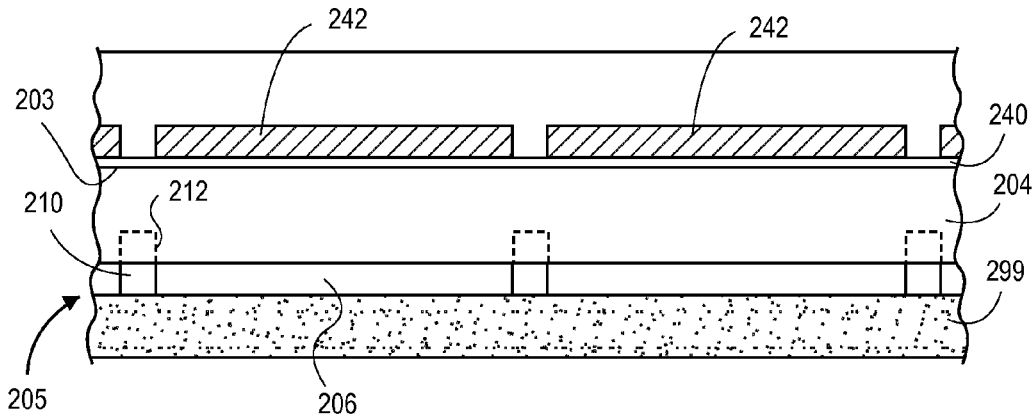

Referring to FIG. 2E, the backside-bumped semiconductor substrate or wafer 204 is demounted from the carrier wafer 298 and is mounted to a second carrier film or tape 299 from the semiconductor substrate or wafer 204 front side 205. A mask layer 202 is formed on the semiconductor substrate or wafer 204 backside 203, i.e., on or above the arrays 242 of metal bumps. The mask layer 202 may be formed in a coating and baking operation.

Figure 2F:
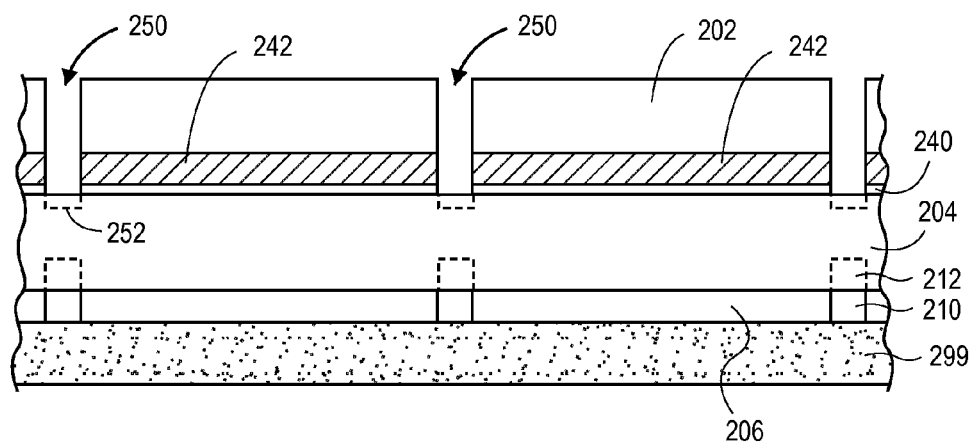

Referring to FIG. 2F, the mask layer 202 and the passivation layer 240 are scribed from the semiconductor substrate or wafer 204 backside 203 with a second laser scribing process to provide laser scribe lines 250. In one embodiment, the scribing is performed between the arrays 242 of metal bumps, as is depicted in FIG. 2F. The laser scribe lines 250 may terminate at the backside 203 of the semiconductor substrate or wafer 204 or may extend as trenches 252 into the semiconductor substrate or wafer 204. In accordance with an embodiment of the present invention, the scribe lines 250 are aligned with the scribe lines 210 formed during the first laser scribing operation, as is also depicted in FIG. 2F.

Figure 2G:
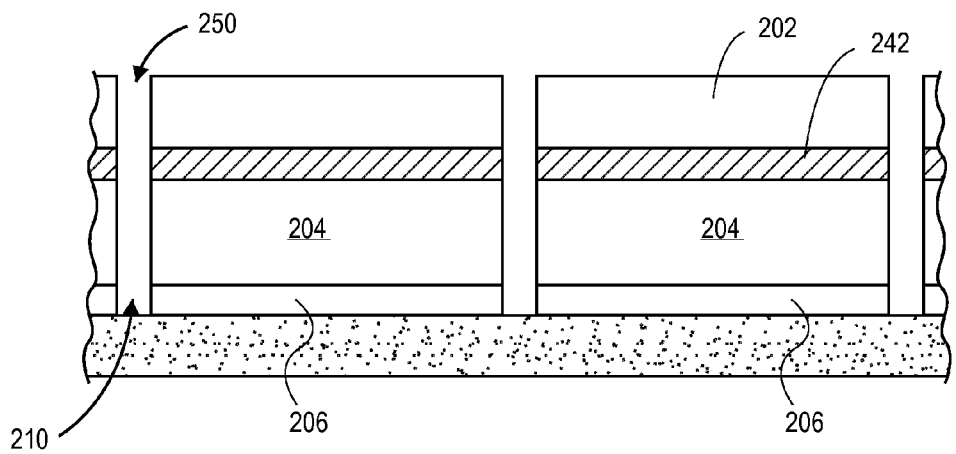

Referring to FIG. 2G, a plasma etch process is used to singulate the semiconductor substrate or wafer 204 into individual ICs (i.e., as individual ICs 206). In an embodiment, the plasma etch is performed through scribe lines 250, using the laser scribed mask 202 to protect the arrays 242 of metal bumps during the plasma etching. In one such embodiment, the plasma etch process is used to connect scribe lines 250 and 210, effectively singulating the IC's without interference from street or backside bump materials. In one such embodiment, the plasma etching extends trenches 252 to meet with trenches 212.

Figure 2H:
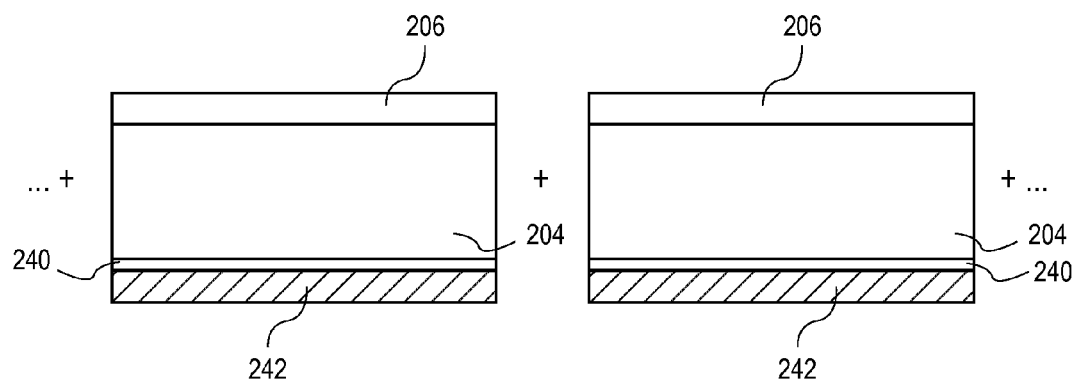

Referring to FIG. 2H, following singulation, subsequent processing may include mask 202 material removal, die cleaning, and die pick from the second carrier film or tape 299.

Thus, in accordance with an embodiment of the present invention, a combination of front side laser scribing and backside laser scribing and plasma etching is used to dice a semiconductor wafer into individualized or singulated integrated circuits with metal bumps being formed between the front side and backside laser scribing operations. In one embodiment, both laser scribing operations are used as essentially, if not totally, non-thermal processes. For example, the front side and backside laser scribing may be localized with no or negligible heat damage zone. In an embodiment, approaches herein are used to singulate integrated circuits having ultra-low k films, and wafers having metallization and device layers on the front surface and having metal bumps and associated dielectric layers on the back surfaces.

In an embodiment, the semiconductor wafer or substrate 204 that is scribed is composed of a material suitable to withstand a fabrication process and upon which semiconductor processing layers may suitably be disposed. For example, in one embodiment, the semiconductor wafer or substrate is composed of a group IV-based material such as, but not limited to, crystalline silicon, germanium or silicon/germanium. In a specific embodiment, providing the semiconductor wafer includes providing a monocrystalline silicon substrate. In a particular embodiment, the monocrystalline silicon substrate is doped with impurity atoms. In another embodiment, the semiconductor wafer or substrate is composed of a III-V material such as, e.g., a III-V material substrate used in the fabrication of light emitting diodes (LEDs).

In an embodiment, the semiconductor wafer or substrate 204 has disposed on its front side an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. One or more of the dielectric layers can be a low-k dielectric layer. A low K dielectric layer is a layer having a dielectric constant of less than the dielectric constant of 4.0 for silicon dioxide. In a specific embodiment, the low K dielectric layers are composed of a carbon-doped silicon oxide material.

Referring again to FIG. 2E, in an embodiment, the mask layer 202 is or includes a layer such as, but not limited to, a water-soluble layer, a UV-curable mask layer, a photo-resist layer, or a Teflon or Teflon-like (polymeric $CF_2$) layer.

In the case that mask layer 202 is a water-soluble mask layer, in an embodiment, the water-soluble layer is readily dissolvable in an aqueous media. For example, in one embodiment, the water-soluble layer is composed of a material that is soluble in one or more of an alkaline solution, an acidic solution, or in deionized water. In an embodiment, the water-soluble layer maintains its water solubility upon a heating process, such as heating approximately in the range of 50-160 degrees Celsius. For example, in one embodiment, the water-soluble layer is soluble in aqueous solutions following exposure to chamber conditions used in a laser and plasma etch singulation process. In one embodiment, the water-soluble die layer is composed of a material such as, but not limited to, polyvinyl alcohol, polyacrylic acid, dextran, polymethacrylic acid, polyethylene imine, or polyethylene oxide. In a specific embodiment, the water-soluble layer has an etch rate in an aqueous solution approximately in the range of 1-15 microns per minute and, more particularly, approximately 1.3 microns per minute. In another specific embodiment, the water-soluble layer is formed by a spin-on technique.

In the case that mask layer 202 is a UV-curable mask layer, in an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In the case that mask layer 202 is a photo-resist layer, in an embodiment, the mask layer is composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In the case that mask layer 202 is a Teflon or Teflon-like (polymeric $CF_2$) layer, in an embodiment, forming the mask involves forming a layer deposited in a plasma deposition process. For example, in one such embodiment, a polymeric $CF_2$ layer is deposited in a plasma deposition process involving the gas $C_4F_8$.

In an embodiment, one or both of the front side or backside laser scribing processes involves using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as low-k dielectric layers and backside metallization layers.

Figure 3:
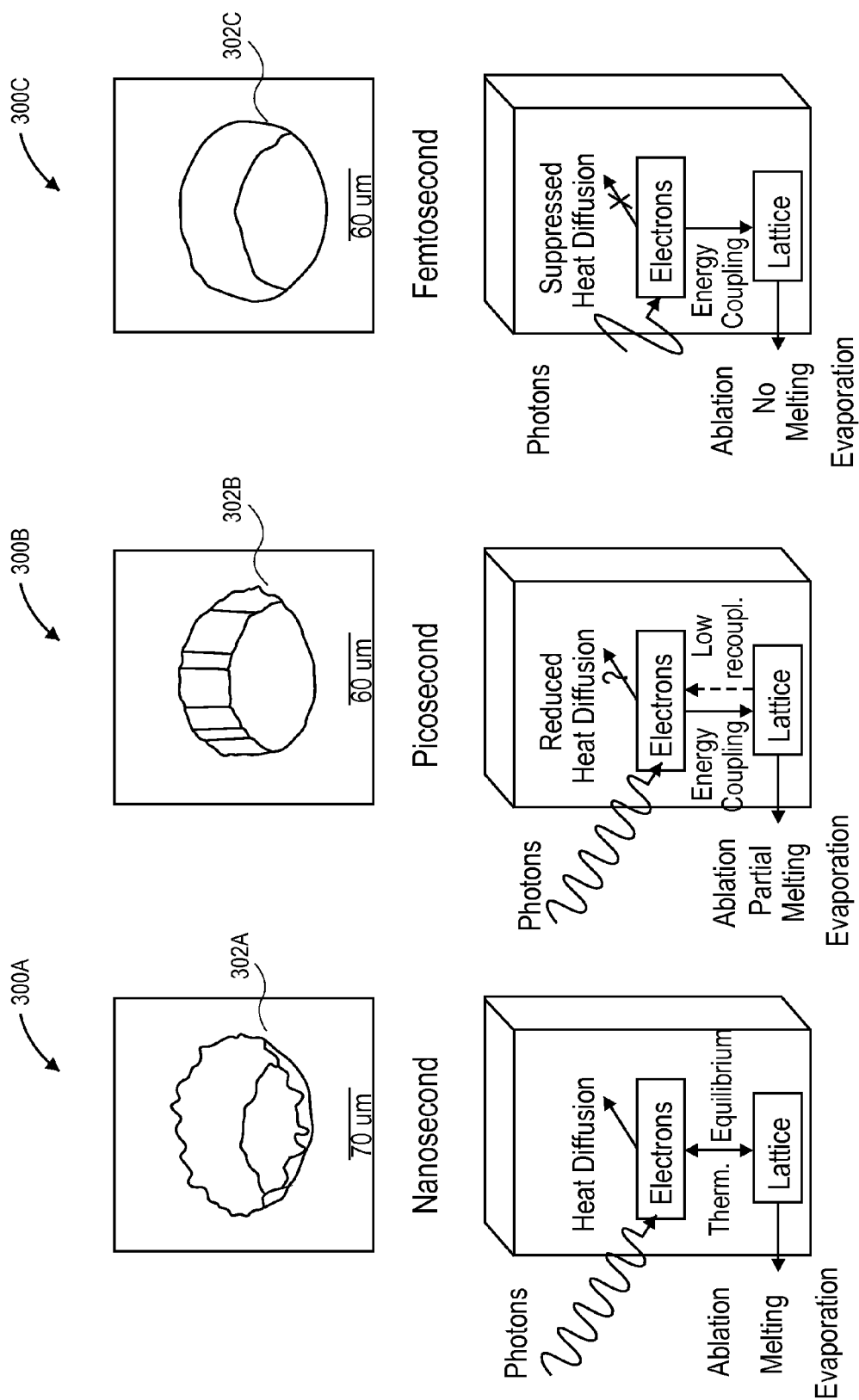
FIG. 3 illustrates the effects of using a laser pulse in the femtosecond range versus longer pulse times, in accordance with an embodiment of the present invention.

FIG. 3 illustrates the effects of using a laser pulse in the femtosecond range versus longer frequencies, in accordance with an embodiment of the present invention. Referring to FIG. 3, by using a laser with a pulse width in the femtosecond range heat damage issues are mitigated or eliminated (e.g., minimal to no damage 302C with femtosecond processing of a via 300C) versus longer pulse widths (e.g., damage 302B with picosecond processing of a via 300B and significant damage 302A with nanosecond processing of a via 300A). The elimination or mitigation of damage during formation of via 300C may be due to a lack of low energy recoupling (as is seen for picosecond-based laser ablation) or thermal equilibrium (as is seen for nanosecond-based laser ablation), as depicted in FIG. 3. However, nano-second, picosecond- or femtosecond-based laser scribing may be considered for embodiments herein.

As mentioned above, in an embodiment, etching the semiconductor wafer or substrate includes using a plasma etching process. In one embodiment, an ultra-high-density plasma source is used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of treating and/or etching silicon may be used. In a specific embodiment, the etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In an embodiment, a through-silicon via type etch process is used for the plasma etching operation described in association with FIG. 2G. For example, in a specific embodiment, the etch rate of the material of semiconductor wafer 204 is greater than 25 microns per minute. In an exemplary embodiment, a deep silicon etch is used to etch a single crystalline silicon substrate or wafer at an etch rate greater than approximately 40% of conventional silicon etch rates while maintaining essentially precise profile control and virtually scallop-free sidewalls. In another embodiment, the plasma etching operation described in association with FIG. 2G employs a conventional Bosch-type dep/etch/dep process to etch through the substrate. Generally, a Bosch-type process consists of three sub-operations: deposition, a directional bombardment etch, and isotropic chemical etch which is run through many iterations (cycles) until silicon is etched through. However, as a result of the Bosch process, the sidewall surface takes a scallop structure which can be rough. This is particularly the effect where the laser scribing process generates an open trench much rougher than that which a lithographically defined etch process achieves. Such a rough die edge leads to lower than expected die break strength. In addition, the deposition sub-step in a Bosch process generates a fluorine-rich Teflon-type organic film to protect the already etched sidewall which is not removed from the sidewall as the etch front proceeds (generally such polymer is only removed periodically from the bottom of the anisotropically etched trench). Accordingly, following the anisotropic Bosch-type plasma etch operation, the integrated circuits are in singulated form. Subsequently, in an embodiment, an isotropic chemical wet or plasma etch is applied to smoothen the sidewall by gently etching a thin layer of substrate (e.g., silicon) off the side wall. In an embodiment, the isotropic portion of the etching is based on a plasma generated from a combination of $NF_3$ and $CF_4$ as the etchant for sidewall smoothening treatment. Also, a higher bias power such as 1000 W is used. In an embodiment, an advantage of using a plasma generated from a combination of $NF_3$ and $CF_4$ as an etchant for sidewall smoothening lies in the lower isotropic etch rate (approximately 0.15 um/min) so the smoothening treatment is more controllable. The high bias power is applied to achieve relatively high directional etch rates to etch off the ridges or rims on the sidewall.

In another embodiment, a plurality of integrated circuits may be separated by streets having a width of approximately 10 microns or smaller. The use of a backside laser scribing and front side laser scribing and plasma etching dicing approach, at least in part due to the tight profile control of the laser, may enable such compaction in a layout of integrated circuits. For example, FIG. 4 illustrates compaction on a semiconductor wafer or substrate achieved by using narrower streets versus conventional dicing which may be limited to a minimum width, in accordance with an embodiment of the present invention.

Figure 4:
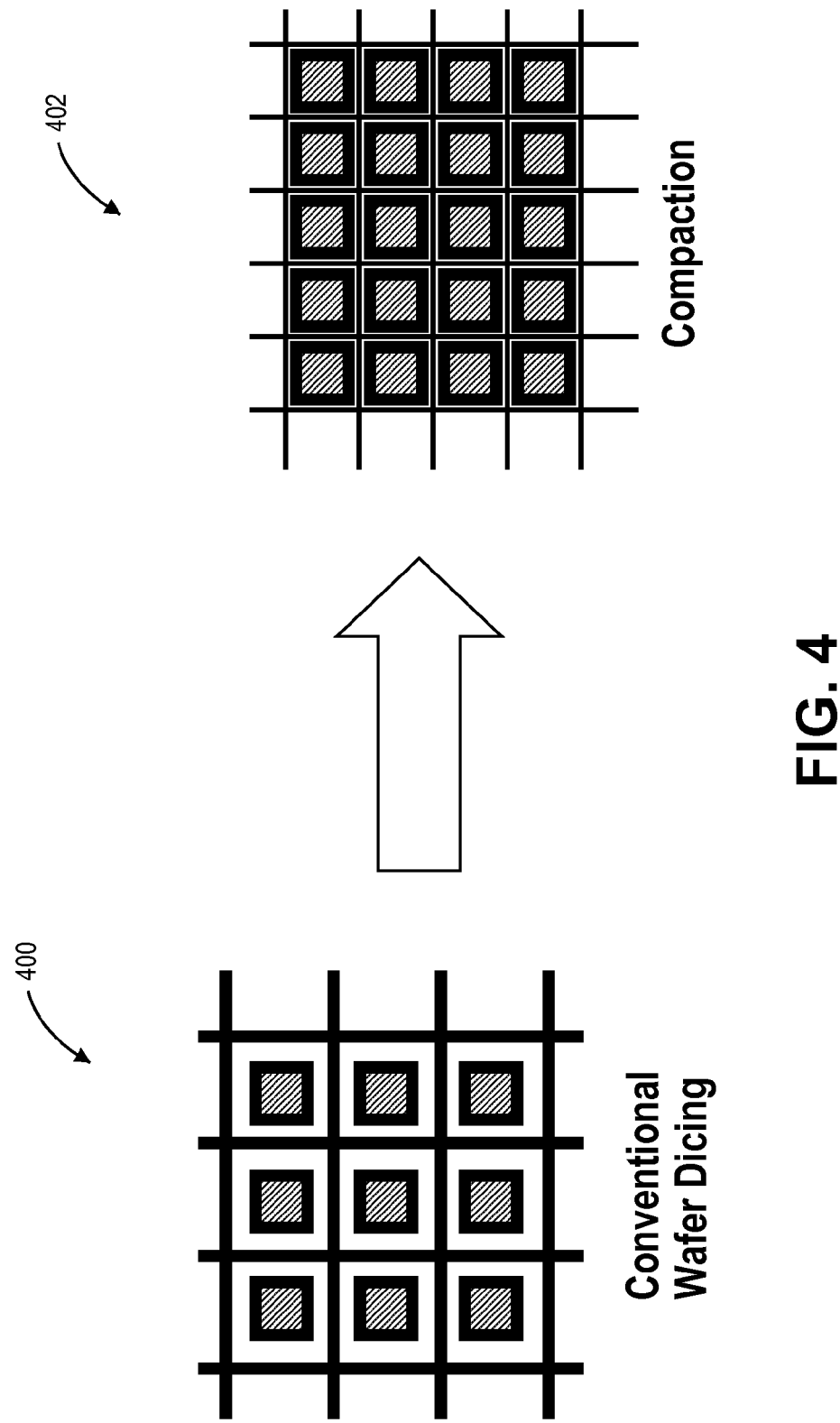
FIG. 4 illustrates compaction on a semiconductor wafer achieved by using narrower streets versus conventional dicing which may be limited to a minimum width, in accordance with an embodiment of the present invention.

Referring to FIG. 4, compaction on a semiconductor wafer is achieved by using narrower streets (e.g., widths of approximately 10 microns or smaller in layout 402) versus conventional dicing which may be limited to a minimum width (e.g., widths of approximately 70 microns or larger in layout 400). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 5:
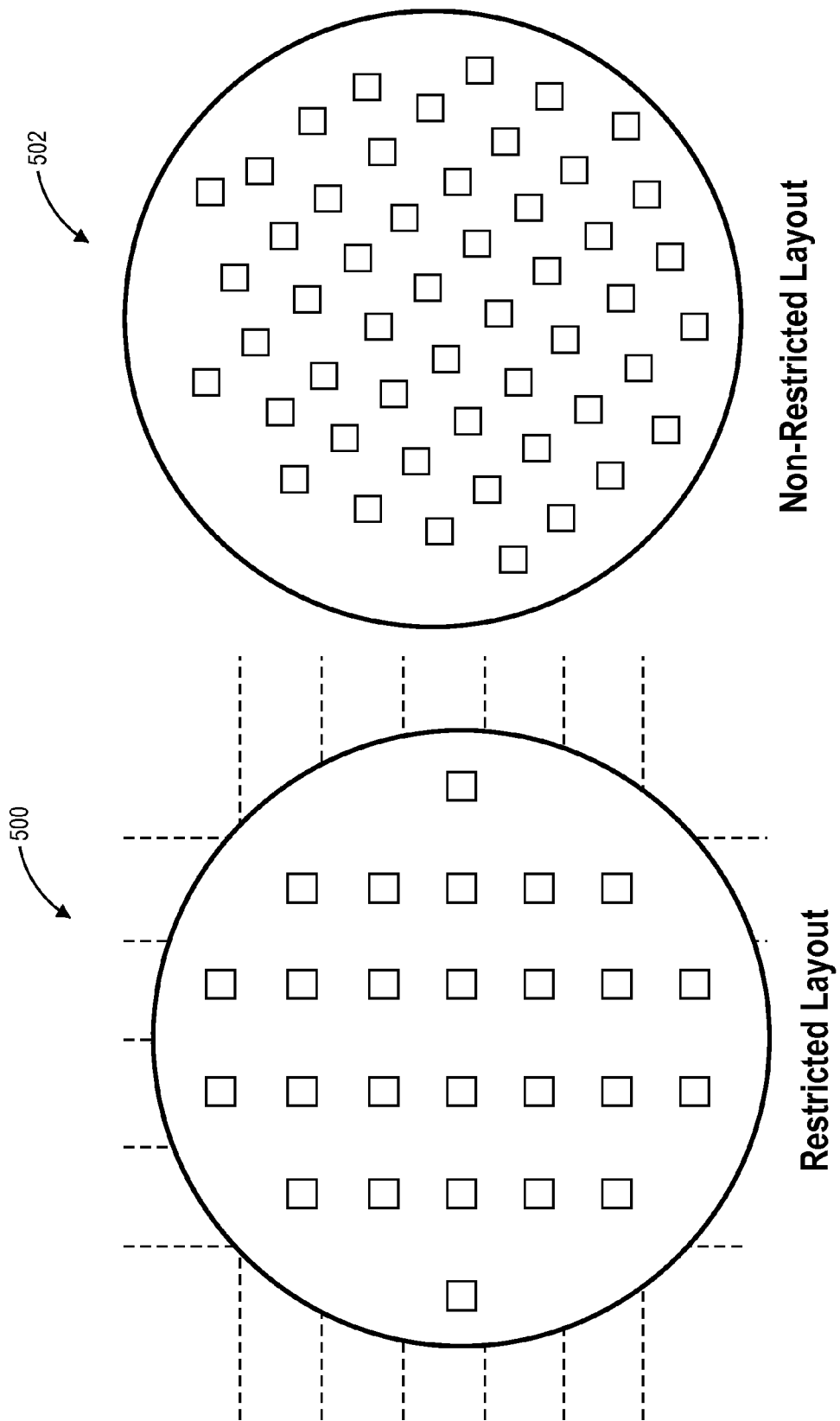
FIG. 5 illustrates freeform integrated circuit arrangement allowing denser packing and, hence, more die per wafer versus grid alignment approaches, in accordance with an embodiment of the present invention.

In another embodiment, a plurality of integrated circuits may be arranged on a semiconductor wafer or substrate in a non-restricted layout. For example, FIG. 5 illustrates freeform integrated circuit arrangement allowing denser packing. The denser packing may provide for more die per wafer versus grid alignment approaches, in accordance with an embodiment of the present invention. Referring to FIG. 5, a freeform layout (e.g., a non-restricted layout on semiconductor wafer or substrate 502) allows denser packing and hence more die per wafer versus grid alignment approaches (e.g., a restricted layout on semiconductor wafer or substrate 500). In an embodiment, the speed of the laser ablation and plasma etch singulation process is independent of die size, layout or the number of streets.

A single process tool may be configured to perform many or all of the operations in a front side laser scribe plus backside bump formation and laser scribe and plasma etch dicing process. For example, FIG. 6 illustrates a block diagram of a tool layout for laser and plasma dicing of wafers or substrates, in accordance with an embodiment of the present invention.

Figure 6:
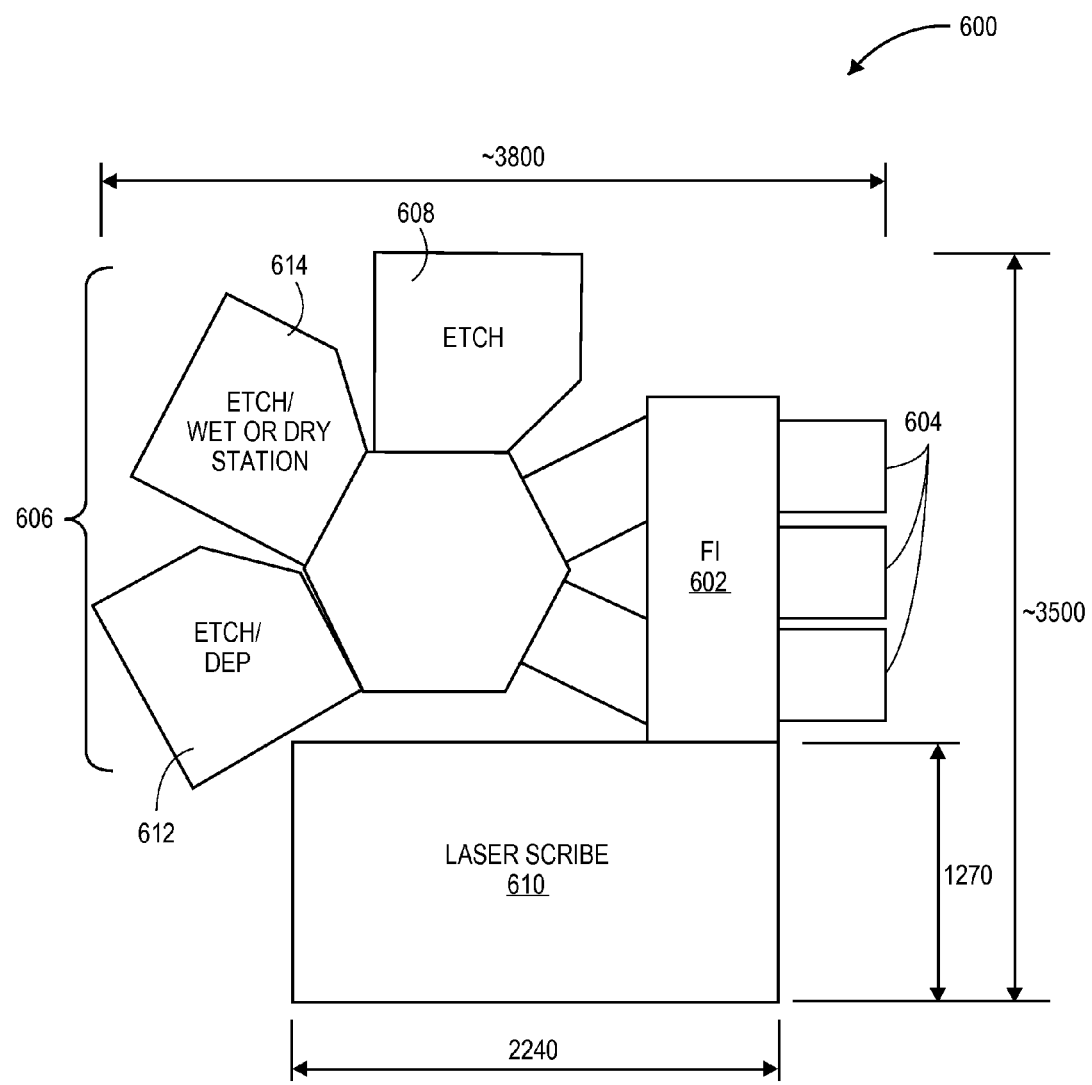
FIG. 6 illustrates a block diagram of a tool layout for laser scribing and plasma dicing of wafers or substrates, in accordance with an embodiment of the present invention.

Referring to FIG. 6, a process tool 600 includes a factory interface 602 (FI) having a plurality of load locks 604 coupled therewith. A cluster tool 606 is coupled with the factory interface 602. The cluster tool 606 includes one or more plasma etch chambers, such as plasma etch chamber 608. A laser scribe apparatus 610 is also coupled to the factory interface 602. The overall footprint of the process tool 600 may be, in one embodiment, approximately 3500 millimeters (3.5 meters) by approximately 3800 millimeters (3.8 meters), as depicted in FIG. 6.

In an embodiment, the laser scribe apparatus 610 houses a nanosecond, picosecond- or femtosecond-based laser, and preferably a femto-second based laser. The nanosecond, picosecond- or femtosecond-based laser is suitable for performing a backside and/or front side laser ablation portion of a laser and etch singulation process, such as the laser abalation processes described above. In one embodiment, a moveable stage is also included in laser scribe apparatus 600, the moveable stage configured for moving a wafer or substrate (or a carrier thereof) relative to the picosecond- or femtosecond-based laser. In a specific embodiment, the nanosecond-, picosecond- or femtosecond-based laser is also moveable. The overall footprint of the laser scribe apparatus 610 may be, in one embodiment, approximately 2240 millimeters by approximately 1270 millimeters, as depicted in FIG. 6.

In an embodiment, the one or more plasma etch chambers 608 is an Applied Centura® Silvia™ Etch system, available from Applied Materials of Sunnyvale, Calif., USA. The etch chamber may be specifically designed for a silicon etch or treatment used in a process to create singulate integrated circuits housed on or in single crystalline silicon substrates or wafers. In an embodiment, a high-density plasma source is included in the plasma etch chamber 608 to facilitate high silicon etch rates. In an embodiment, more than one etch chamber is included in the cluster tool 606 portion of process tool 600 to enable high manufacturing throughput of the singulation or dicing process.

The factory interface 602 may be a suitable atmospheric port to interface between an outside manufacturing facility with laser scribe apparatus 610 and cluster tool 606. The factory interface 602 may include robots with arms or blades for transferring wafers (or carriers thereof) from storage units (such as front opening unified pods) into either cluster tool 606 or laser scribe apparatus 610, or both.

Cluster tool 606 may include other chambers suitable for performing functions in a method of singulation. For example, in one embodiment, in place of an additional etch chamber, a deposition chamber 612 is included. The deposition chamber 612 may be configured for mask deposition on or above a backside of a wafer or substrate prior to laser scribing from the backside of the wafer or substrate. In one such embodiment, the deposition chamber 612 is suitable for depositing a water soluble mask layer. In another embodiment, in place of an additional etch chamber, a wet/dry station 614 is included. The wet/dry station may be suitable for cleaning residues and fragments, or for removing a water soluble mask, e.g., subsequent to a laser scribe and plasma etch singulation process from the backside of a substrate or wafer. In another embodiment, the deposition chamber 612 is suitable for depositing a UV-curable mask layer, and a UV source is included with the tool. In an embodiment, a metrology station is also included as a component of process tool 600.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 600 described in association with FIG. 6. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
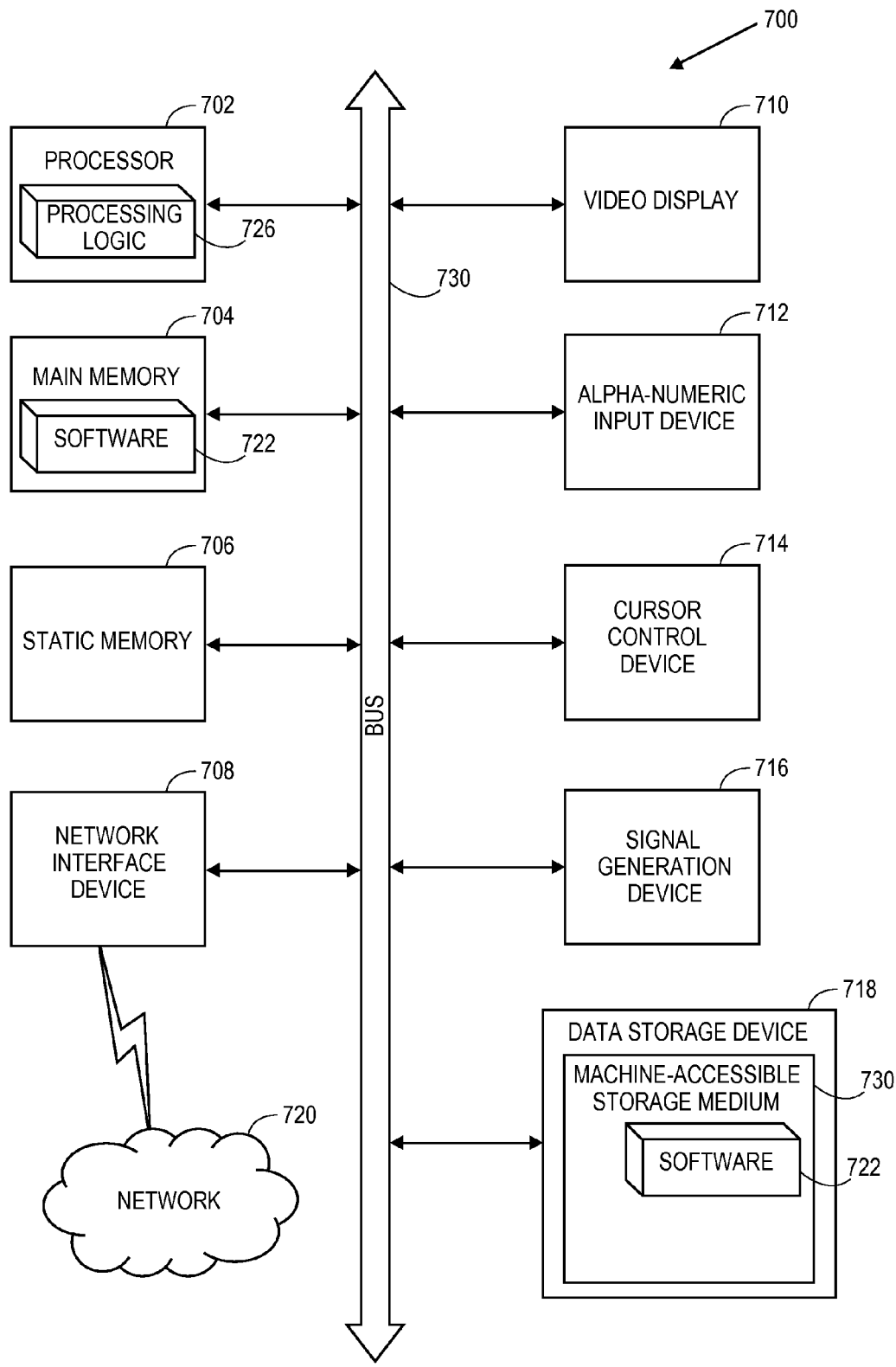
FIG. 7 illustrates a block diagram of an exemplary computer system, in accordance with an embodiment of the present invention.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 731 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media. In accordance with an embodiment of the present invention, a machine-accessible storage medium has instructions stored thereon which cause a data processing system to perform an above described method of dicing a semiconductor wafer having a plurality of integrated circuits.

Thus, approaches for front side laser scribe plus backside bump formation and laser scribe and plasma etch dicing processing have been disclosed.

What is claimed is:

1. A method of dicing a semiconductor wafer comprising integrated circuits on a front side thereof, the method comprising:
   forming first scribe lines on the front side, between the integrated circuits, with a first laser scribing process;
   forming arrays of metal bumps on a backside of the semiconductor wafer, each array corresponding to one of the integrated circuits;
   forming a mask layer on the backside, covering the arrays of metal bumps;
   forming second scribe lines on the backside, between the arrays of metal bumps, with a second laser scribing process, wherein the second scribe lines are aligned with the first scribe lines, and wherein the mask layer is patterned by the second laser scribing process;
   plasma etching the semiconductor wafer through the second scribe lines to singulate the integrated circuits; and
   removing the mask layer subsequent to the plasma etching.

2. The method of claim 1, further comprising:
   prior to forming the arrays of metal bumps, thinning the semiconductor wafer.

3. The method of claim 2, wherein the thinning is performed subsequent to the first laser scribing process.

4. The method of claim 1, wherein the mask layer is a water-soluble mask layer, and removing the mask layer comprising using an aqueous-based solution.

5. The method of claim 1, wherein the first and second laser scribing processes involve using the same laser.

6. The method of claim 5, wherein the first and second laser scribing processes involve using a femtosecond-based laser.

7. The method of claim 1, wherein performing the first laser scribing process comprises forming trenches partially into the front side of the semiconductor wafer.

8. The method of claim 1, wherein performing the second laser scribing process comprises forming trenches partially into the backside of the semiconductor wafer.

9. A method of dicing a semiconductor wafer comprising a front side having integrated circuits with first scribe lines there between, the method comprising:
   forming arrays of metal bumps on a backside of the semiconductor wafer, each array corresponding to one of the integrated circuits;
   forming a mask layer on the backside, covering the arrays of metal bumps;
   forming second scribe lines on the backside, between the arrays of metal bumps, with a laser scribing process, wherein the second scribe lines are aligned with the first scribe lines, and wherein the mask layer is patterned by the laser scribing process;
   plasma etching the semiconductor wafer through the second scribe lines to singulate the integrated circuits; and
   removing the mask layer subsequent to the plasma etching.

10. The method of claim 9, further comprising:
    prior to forming the arrays of metal bumps, thinning the semiconductor wafer.

11. The method of claim 9, wherein the mask layer is a water-soluble mask layer, and removing the mask layer comprising using an aqueous-based solution.

12. The method of claim 9, wherein the laser scribing process involves using a femtosecond-based laser.

13. The method of claim 9, wherein performing the laser scribing process comprises forming trenches partially into the backside of the semiconductor wafer.

14. A method of dicing a semiconductor wafer comprising integrated circuits on a front side thereof, the method comprising:
   forming a mask layer on the backside, covering the arrays of metal bumps;
   forming first scribe lines on the front side, between the integrated circuits, with a first laser scribing process;
   subsequent to forming the first scribe lines with the first laser scribing process, forming second scribe lines on the backside between arrays of metal bumps formed on the backside, the second scribe lines formed with a second laser scribing process, wherein the second scribe lines are aligned with the first scribe lines, and wherein the mask layer is patterned by the second laser scribing process;
   plasma etching the semiconductor wafer through the second scribe lines to singulate the integrated circuits, and
   removing the mask layer subsequent to the plasma etching.

15. The method of claim 14, wherein the mask layer is a water-soluble mask layer, and removing the mask layer comprising using an aqueous-based solution.

16. The method of claim 14, wherein the first and second laser scribing processes involve using the same laser, and wherein the first and second laser scribing processes involve using a femtosecond-based laser.

17. The method of claim 14, wherein performing the first laser scribing process comprises forming trenches partially into the front side of the semiconductor wafer, and wherein performing the second laser scribing process comprises forming trenches partially into the backside of the semiconductor wafer.

18. A method of dicing a semiconductor wafer comprising integrated circuits on a front side thereof, the method comprising:
   forming first scribe lines on the front side, between the integrated circuits, with a first laser scribing process;
   forming arrays of metal bumps on a backside of the semiconductor wafer, each array corresponding to one of the integrated circuits;
   forming second scribe lines on the backside, between the arrays of metal bumps, with a second laser scribing process, wherein the second scribe lines are aligned with the first scribe lines, and wherein the first and second laser scribing processes involve using the same laser; and
   plasma etching the semiconductor wafer through the second scribe lines to singulate the integrated circuits.

19. The method of claim 18, further comprising:
    prior to forming the arrays of metal bumps, thinning the semiconductor wafer.

20. The method of claim 19, wherein the thinning is performed subsequent to the first laser scribing process.

21. The method of claim 18, wherein the first and second laser scribing processes involve using a femtosecond-based laser.

22. The method of claim 18, wherein performing the first laser scribing process comprises forming trenches partially into the front side of the semiconductor wafer.

23. The method of claim 18, wherein performing the second laser scribing process comprises forming trenches partially into the backside of the semiconductor wafer.

24. A method of dicing a semiconductor wafer comprising integrated circuits on a front side thereof, the method comprising:
   forming first scribe lines on the front side, between the integrated circuits, with a first laser scribing process; and, subsequently,
   forming second scribe lines on the backside between arrays of metal bumps formed on the backside, the second scribe lines formed with a second laser scribing process, wherein the second scribe lines are aligned with the first scribe lines, wherein the first and second laser scribing processes involve using the same laser, and wherein the first and second laser scribing processes involve using a femtosecond-based laser; and
   plasma etching the semiconductor wafer through the second scribe lines to singulate the integrated circuits.

25. The method of claim 24, wherein performing the first laser scribing process comprises forming trenches partially into the front side of the semiconductor wafer, and wherein performing the second laser scribing process comprises forming trenches partially into the backside of the semiconductor wafer.

* * * * *